(12) United States Patent
Cummins

(10) Patent No.: US 8,514,018 B2
(45) Date of Patent: Aug. 20, 2013

(54) SIGNAL ALIGNMENT FOR ENVELOPE TRACKING SYSTEM

(75) Inventor: Shaun Cummins, Cambourne (GB)

(73) Assignee: Nujira Limited (GB)

( * ) Notice: Subject to any disclaimer, the term of this patent is extended or adjusted under 35 U.S.C. 154(b) by 0 days.

(21) Appl. No.: 13/075,407

(22) Filed: Mar. 30, 2011

(65) Prior Publication Data

US 2012/0019320 A1 Jan. 26, 2012

(30) Foreign Application Priority Data

Mar. 30, 2010 (GB) .................................. 1005397.3

(51) Int. Cl.
*H03F 1/26* (2006.01)

(52) U.S. Cl.
USPC ............................. 330/149; 330/136; 330/297

(58) Field of Classification Search
USPC .................................. 330/127, 136, 149, 297
See application file for complete search history.

(56) References Cited

U.S. PATENT DOCUMENTS

| | | | |
|---|---|---|---|
| 6,725,021 B1 * | 4/2004 | Anderson et al. ........... | 455/115.1 |
| 6,774,719 B1 * | 8/2004 | Wessel et al. .................. | 330/136 |
| 7,095,278 B2 * | 8/2006 | Fuller et al. ................... | 330/149 |
| 7,239,203 B2 * | 7/2007 | Shanbhag ...................... | 330/149 |
| 7,263,135 B2 | 8/2007 | Takabayashi et al. | |
| 7,372,917 B2 | 5/2008 | Jensen | |
| 8,126,411 B2 * | 2/2012 | Kim ............................... | 455/126 |
| 2008/0205571 A1 * | 8/2008 | Muhammad et al. .......... | 375/376 |
| 2010/0052781 A1 * | 3/2010 | Nentwig ........................ | 330/149 |

FOREIGN PATENT DOCUMENTS

| | | |
|---|---|---|
| EP | 1 598 943 A1 | 11/2005 |
| EP | 1 811 735 A1 | 7/2007 |
| WO | 00/31881 A1 | 6/2000 |

OTHER PUBLICATIONS

Intellectual Property Office, "British Search Report for British Application No. GB 1005397.3", Jul. 6, 2010, Publisher: British Intellectual Property Office, Published in: GB.

* cited by examiner

*Primary Examiner* — Khanh V Nguyen

(74) *Attorney, Agent, or Firm* — Kaplan Breyer Schwarz & Ottesen, LLP

(57) ABSTRACT

There is disclosed a method for determining the timing misalignment between a power supply and an output in an envelope tracking amplification stage, the method including the steps of: estimating a distortion parameter in the amplification stage; and determining a timing error in dependence on the estimated distortion parameter.

16 Claims, 13 Drawing Sheets

SIGNAL ALIGNMENT FOR ENVELOPE TRACKING SYSTEM

CROSS REFERENCE TO RELATED APPLICATIONS

British Application Number GB 1005397.3, filed Mar. 30, 2010, is incorporated herein by reference.

FIELD OF THE INVENTION

The present invention relates to the selection or adjustment of the timing of an applied supply voltage level in an arrangement in which the supply voltage is variable to track a reference level, such reference level representing a signal to be amplified or a demand for energy to be supplied.

BACKGROUND OF THE INVENTION

Currently communication systems typically employ linear modulation schemes that exhibit high peak-to-average power ratios to achieve high capacity. Signals subjected to such modulation have a wide dynamic range, infrequently achieve peak levels, and frequently operate below peak levels. To provide linear amplification for signals subjected to such modulation, traditional amplifier architectures operate significantly below their peak level. This generally results in poor efficiency.

A number of techniques exist to improve efficiency based on adjusting the amplifier supply voltage. Notable amongst the supply voltage-based efficiency enhancement schemes are those of envelope tracking and envelope elimination and restoration.

These two techniques improve efficiency by dynamically adjusting or tracking the supply to the amplifier device in harmony with the power demand or envelope of the signal to be amplified. When applied to an amplifier stage, the dynamic adjustment of the supply alters the bias of the amplifying element which results in high energy conversion efficiency between the amplifier supply and the amplified output signal.

A known problem in implementing dynamic supply adjustment amplifiers is the need for tight timing synchronisation or alignment between the dynamic supply voltage applied to the amplifying element and the energy demanded by the signal to be amplified. In other words, there is a need for the envelope of the power supply delivered to the amplifier to align with the envelope of the amplified output signal. The absence of such alignment may result in a reduction in the power efficiency of the power amplifier and distortion of the amplifier output signal, which distortion is unacceptable to the end application. These problems also present extra challenges for any spectral improvement systems, such as pre-distortion blocks, associated with the amplifier stage.

A particular advantageous application of envelope tracking amplifiers is in solving the problem of high efficiency radio frequency amplification of modulation signals having high peak-to-average ratio. However in such an application the amplification element, being a radio frequency (RF) transistor, tends to produce unacceptable output distortion in the presence of a timing misalignment of the dynamic supply and input signal to amplify.

Historically alignment has been carried out manually using either maximum power to establish crude alignment or symmetry and best adjacent channel power measurements with the use of a non-memory adaptive pre-distortion system.

A known prior art solution to the timing alignment problem is to monitor the amplifier output signal, with resulting timing related distortion, and then to adjust the timing of the dynamics or the timing of the signal to be amplified using an associated delay element in order to set an optimal timing for minimal distortion.

The implementation of timing tracking in this way lends itself to an amplifier system that also deploys adaptive linearity control in the form of a pre-distortion block. In this instance the circuitry necessary for accurate measurement and comparison of the amplifier output signal is already present within the amplifier linearity control system.

For amplifiers that do not require adaptive linearity control, or those that employ alternative linearity control mechanisms, the cost and complexity of providing output measurements and, in particular for RF systems, down-conversion frequency translation, is undesirable and may be prohibitive.

It is an aim of the invention to provide an improved technique to address one or more of the above-stated problems.

In particular it is an aim of the invention to provide a timing alignment mechanism that does not require direct measurement of the amplifier output signal and therefore does not require any associated measurement circuitry.

SUMMARY OF THE INVENTION

The invention provides techniques for the measurement of timing alignment error between the RF power envelope and the power supply envelope to facilitate automatic adaptive correction. The invention uses, in embodiments, distortion in the amplifier to determine the amount and direction of alignment. In a first embodiment the distortion is manifested in phase. In a second embodiment the distortion is manifested in amplitude. Once the size and direction of the alignment error is estimated, an appropriate adjustment of delay in one or more parts, and in particular one or more base band systems, of the amplification stage can be made. Measurements may be continuously made and adjustments carried out continuously or periodically. An automatic alignment system is thus created.

The embodiments of the invention rely upon an accurate estimate of the actual power supply envelope voltage being created, from capture of portions of the RF modulation present on the output of the power amplifier and known information about the input to the amplifier.

The invention provides a method for determining the timing misalignment between a power supply and an output in an envelope tracking amplification stage, the method including the steps of: estimating a distortion parameter in the amplification stage; and determining a timing error in dependence on the estimated distortion parameter.

The step of estimating the distortion parameter may further include the step of determining an idealised power supply.

The step of determining an idealised power supply may include the steps of capturing a portion of the output and a portion of an input, representing an idealised reference, in the amplification stage, said portions being captured for a corresponding time period.

The step of determining an idealised power supply may further include the steps of: correlating the captured portions of the output and the input; aligning the input to the output in dependence on the correlation result; and applying a predetermined shaping function to the aligned input to create the idealised power supply for the time period.

The distortion parameter may be phase. A phase distortion indicative of the timing misalignment may be present in the output signal. The method may further include the step of estimating the phase distortion in the output signal. The step of estimating the phase distortion may comprise subtracting the idealised power supply from the output for the time period.

The method may further include the step of estimating the power supply in dependence on the phase distortion. The step of estimating the power supply in dependence on the phase distortion may be in dependence on a known relationship between the phase distortion and the power supply in a time-aligned idealised case. The method may further include the step of correlating the estimated power supply with the idealised power supply. The method may further include the step of selecting the correlation result having the highest correlation. The time offset position of the highest correlation may represent the timing error.

The distortion parameter may be gain. A gain distortion indicative of the timing misalignment may be present in the output signal. The method may further include the step of estimating the gain distortion in the output signal. The step of estimating the gain distortion includes the steps of: creating a plurality of time-shifted copies of the idealised power supply; and subtracting each time-shifted copy from the idealised power supply to generate a respective plurality of time-shifted estimates of gain distortion. The method may further include the step of applying each gain distortion estimate to the aligned idealised reference to generate a respective plurality of estimates of the output envelope. The method may further include the step of correlating each of the plurality of estimates of the output envelope with the output. The method may further include the step of selecting the correlation result having the highest correlation. The time offset position of the highest correlation may represent the timing error.

The timing error may be used to apply a delay to one or more signals in the amplification stage. The delay may be applied to one or more of the power supply, the input, or an envelope provided to an envelope tracking block. The delay may be the inverse of the timing error.

The invention also provides an envelope tracking amplification stage, adapted to determine the timing misalignment between a power supply and an output of the envelope tracking amplification stage, including: means for estimating a distortion parameter in the amplification stage; and means for determining a timing error in dependence on the estimated distortion parameter.

The means for estimating the distortion parameter may further include means for determining an idealised power supply.

The means for determining an idealised power supply may include means for capturing a portion of the output and means for capturing a portion of an input, representing an idealised reference, in the amplification stage, said portions being captured for a corresponding time period.

The means for determining an idealised power supply may further include: means for correlating the captured portions of the output and the input; means for aligning the input to the output in dependence on the correlation result; and means for applying a predetermined shaping function to the aligned input to create the idealised power supply for the time period.

The distortion parameter may be phase.

The distortion parameter may be gain.

The invention thus provides, in accordance with various embodiments, a technique for the extraction of an estimate of the power supply envelope from captured RF power output signals to allow an automatic adaptive timing alignment system.

Problems such as: commissioning tests; variations in delay of the envelope tracking power supply with temperature, RF power, or desired versions; variations in base band system design; variations in system delay due to power supply voltage etc. are all corrected automatically by a small and simple technique, preferably implemented as an algorithm, that preferably resides inside a predistortion unit block of an amplification stage. No additional tests are required.

The first embodiment uses a large phase distortion present in typical modern power amplifier technologies to extract estimates of power supply envelope. For future technology devices that may exhibit less or no phase distortion with power supply envelope, the second embodiment extracts power supply envelope from amplitude distortion, a problem that all amplifiers suffer from.

The second embodiment may also be implemented in an amplification stage exhibiting phase distortion such as found in modern power amplifier technologies. The first and second embodiments may be used independently or together. The first embodiment only offers improvements in implementations where a phase distortion is present.

BRIEF DESCRIPTION OF THE DRAWINGS

The present invention is described by way of example with reference to the accompanying Figures, in which.

DETAILED DESCRIPTION

The invention is described by way of reference to timing alignment architecture for supplying an envelope tracking (ET) radio frequency (RF) amplification stage. More generally the invention may apply to any arrangement where it is necessary to provide an aligned variable voltage level tracking a load characteristic that is also related to the reference level.

In the implementation of an envelope tracking amplifier the amplifying element, normally a transistor, is driven in response to a stimulus representing the signal to be amplified, while the amplifier supply, normally the transistor collector or drain, is fed or biased using a dynamic supply.

To maximise efficiency the amplifier is typically operated in a class A-B, class-B, or class-C configuration. Under these conditions the current drawn from the supply by the amplifying element is a function of the signal to amplify.

Figure 1:
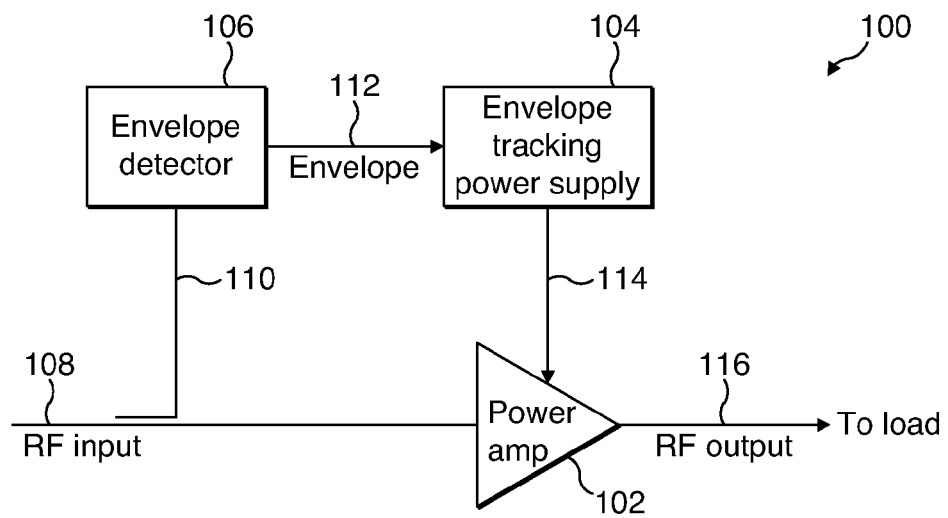
FIG. 1 illustrates schematically a basic amplification stage utilising envelope tracking.

With reference to FIG. 1 there is illustrated a simplified envelope tracking amplification stage to which embodiments of the invention may be applied in order to obtain the advantages of the invention. The amplification stage 100 includes a power amplifier 102, and envelope tracking power supply 104, and an envelope detector 106. A signal to be amplified, typically a RF input signal, is provided on line 108. The RF input signal on line 108 forms an input to the power amplifier 102. This RF input signal is the signal to be amplified by the power amplifier 102. The envelope detector 106 is coupled to the RF input on line 108 by an input line 110. The envelope detector 106 then generates an envelope signal on line 112 representing the envelope of the RF input signal to be amplified. This envelope signal on line 112 forms an input to the envelope tracking power supply 104. The envelope tracking power supply 104 operates in accordance with various techniques well-known in the art to generate a supply voltage on output line 114 to provide the supply to the power amplifier 102. The envelope tracking power supply 104 may, for example, select one of a plurality of switchable power supplies in dependence on an instantaneous amplitude value of the envelope signal on line 112. The power amplifier 102 generates an RF output signal on line 116. The RF output signal on line 116 is an amplified version of the RF input signal on line 108. The RF output signal 116 is preferably delivered to a load. The envelope tracking power supply 104 operates to provide an efficient power supply to the power amplifier 102 to improve the overall efficiency of the amplification stage 100.

As set out in the background section above, in envelope tracking applications it is desirable to align the envelope of the power supply voltage on line 114 with the envelope of the RF output signal on line 116. This provides optimal efficiency and/or maximum spectral performance targets to be met. In accordance with embodiments of the invention timing alignment is achieved by measurement of the RF power output modulation, from which it is possible to extract a timing error in accordance with embodiments of the invention.

Figure 2:
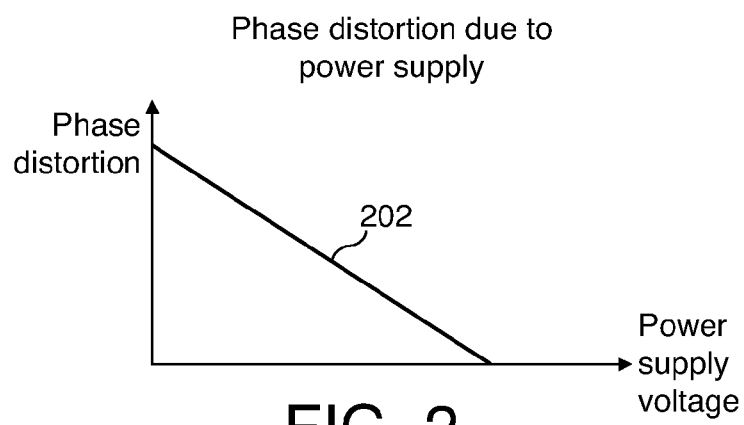
FIG. 2 illustrates the idealised relationship between phase distortion and power supply voltage in an amplification stage.

Modern RF power amplifier technologies (such as LDMOS, GaN, GaAS etc) exhibit changes in delay with changes in their power supply voltage. This manifests itself as a change in modulation phase as a function of power supply voltage. FIG. 2 illustrates a typical relationship between phase distortion and power supply voltage in modern power amplifier technologies. The line 202 illustrates the variation of phase distortion as a consequence of changing power supply voltage. Thus modern power amplifier technologies operated with an envelope tracking power supply exhibit phase modulation as a function of envelope tracking power supply voltage. There is therefore a known, predictable and measurable relationship between phase distortion and power supply voltage. Although FIG. 2 illustrates this relationship as linear, it may in practice be non-linear. This known, predictable and measurable relationship is based on the assumption of an idealised case, where all signals in the amplification stage are aligned.

Figure 3:
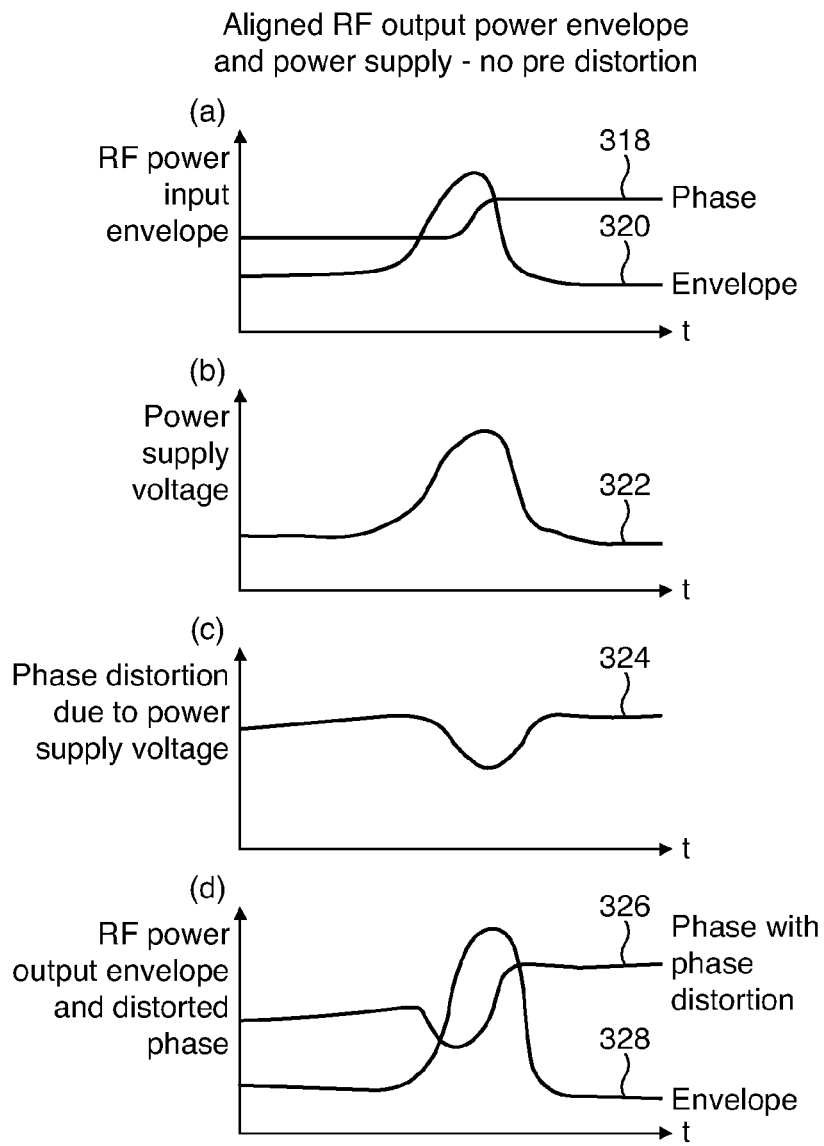
FIGS. 3a to 3d illustrate the effect of phase distortion in an aligned envelope tracking power supply stage.

With reference to FIG. 3, in such an idealised case where all signals are aligned there is illustrated the waveforms at various points of the amplification stage 100 of FIG. 1.

FIG. 3a illustrates the variation of the envelope of the RF power input envelope and phase over time. Reference numeral 320 identifies the envelope variation, and reference numeral 318 identifies the phase variation.

FIG. 3b illustrates the variation of the power supply voltage on line 114 over time. The power supply voltage is identified by reference numeral 322.

FIG. 3c represents the variation of the phase distortion due to the power supply voltage on line 114 over time. This phase distortion is identified by reference numeral 324.

FIG. 3d illustrates the RF output power envelope and distorted phase on line 116. The variation of the envelope over time is identified by reference numeral 328. The variation of the phase, with phase distortion, over time is identified by reference numeral 326. The phase with phase distortion as illustrated by line 326 of FIG. 3d corresponds to the summing of the phase 318 of FIG. 3a and the phase distortion 324 of FIG. 3c. Phase 318 and the phase 324 are aligned in the idealised example. As can be seen in FIG. 3d in comparison to FIG. 3a, the phase distortion due to the power supply voltage causes a change in the phase of the RF output signal relative to the RF input signal.

Figure 4:
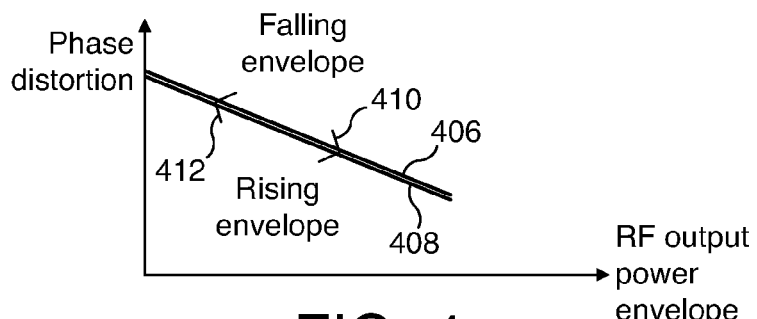
FIG. 4 illustrates the relationship between phase distortion and RF output power in an aligned envelope tracking amplification stage.

With further reference to the idealised case of FIG. 3, FIG. 4 (corresponding to FIG. 2) illustrates the predictable relationship between phase distortion and the RF output power envelope. For both rising and falling RF output power envelopes, the relationship between phase distortion and RF output power envelope follows a predictable path. The line 408 denotes the relationship for a rising envelope, as represented by arrow 410, and a line 406 denotes the relationship for a falling envelope, as denoted by arrow 412. The lines 406 and 408 are effectively coincident. For a falling envelope, i.e. the RF output power envelope decreasing, the phase distortion increases. For a rising envelope the phase distortion decreases.

However in a practical implementation such an idealised scenario does not arise. As discussed in the background section a timing alignment problem is encountered. This problem is described further with reference to FIGS. 5a to 5d and FIG. 6.

Figure 5:
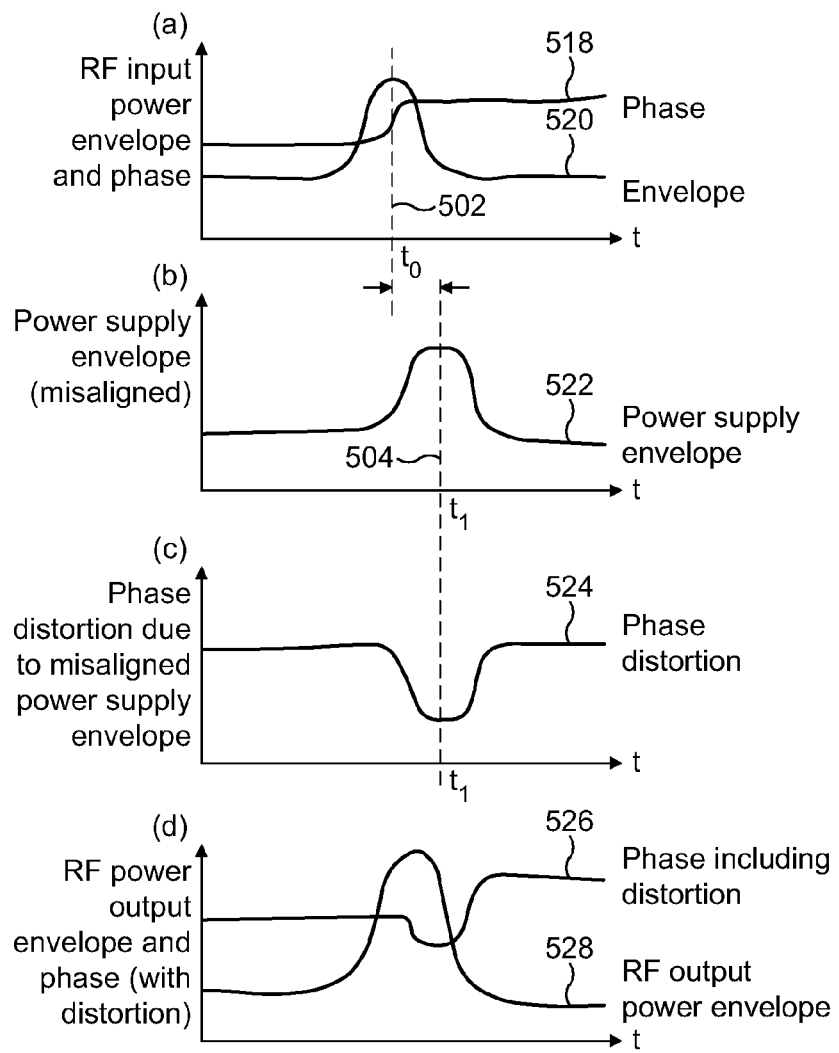
FIGS. 5a to 5d illustrate the effect of phase distortion in a misaligned envelope tracking amplification stage.

FIG. 5a corresponds to FIG. 3a, illustrating the variation of RF input power envelope and phase over time. Reference numeral 518 identifies the phase, and reference numeral 520 identifies the envelope.

FIG. 5b illustrates the variation over time of the power supply envelope, as identified by reference numeral 522. In a practical implementation, there is a time delay between the power supply envelope as illustrated by line 522 and the RF input power envelope as illustrated by line 520. With reference to FIGS. 5a and 5b, it can be seen that the peak of the RF input power envelope occurs at a time $t_0$ denoted by a dash line 502, and a peak of the power supply envelope occurs at a time $t_1$ illustrated by a dash line 504, the time $t_1$ being later than the time $t_0$.

FIG. 5c illustrates the variation of the phase distortion due to the power supply over time, which phase distortion is identified by line 524. By comparison of FIGS. 5b and 5c it can be seen that the phase distortion due to the power supply is aligned with the envelope of the power supply, and consequently the phase distortion due to the power supply is misaligned with the phase distortion, identified by reference numeral 518, of the RF input power signal.

FIG. 5d illustrates the envelope and phase of the RF output power signal on line 116. The phases identified by reference numeral 526 and the envelope is identified by reference numeral 528. The phase of the RF output signal on 116, represented by line 526, is the summation of the phase due to the RF input power envelope (represented by line 518) and the phase due the power supply (represented by line 524). As discussed above, the phase 518 of FIG. 5a is not aligned with the phase 524 of FIG. 5c. These misaligned phases are added together to form the phase 526 of the output signal. Comparing the phase of the output signal represented by line 526 in FIG. 5d, where there is misalignment, with the phase of the output signal represented by line 326 of FIG. 3d (where there is alignment) it can be seen that as a result of the misalignment the phase distortion produced by the power supply occurs later than the RF output power envelope, identified by line 528, leading to a different shape of RF output modulation phase. The envelope of the RF output power signal, represented by line 528, remains aligned with the envelope, represented by line 520, of the RF input power signal.

Figure 6:
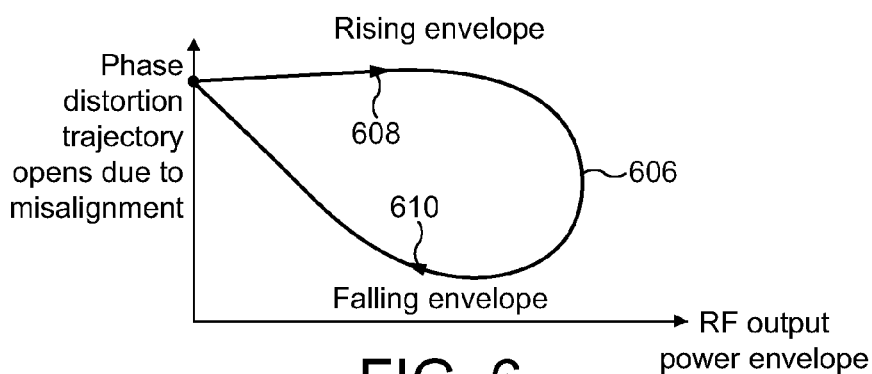
FIG. 6 illustrates the relationship between phase distortion and output power in a misaligned envelope tracking power supply stage.

The problem of this timing misalignment is further illustrated with reference to FIG. 6, which shows the variation of the phase distortion with the RF output power envelope. Whereas in the aligned case as illustrated with reference to FIG. 4 there is a predictable relationship between distortion and the envelope of the output power, in the misaligned case there is not. For a rising envelope the phase distortion follows a trajectory illustrated by arrow 608 of curve 606, whereas for a falling envelope the phase distortion follows a different trajectory as illustrated by arrow 610 of curve 606. The phase distortion trajectory thus changes from a single line to a loop. The loop height is an indication of the presence of an alignment error.

The first embodiment of the invention, described in more detail hereinbelow, relies upon the identification, which can be seen in FIG. 5d, that the phase distortion represented by line 526 is caused as the result of a timing misalignment. If the phase distortion can be identified, then this can provide information to identify the timing misalignment.

Figure 7:
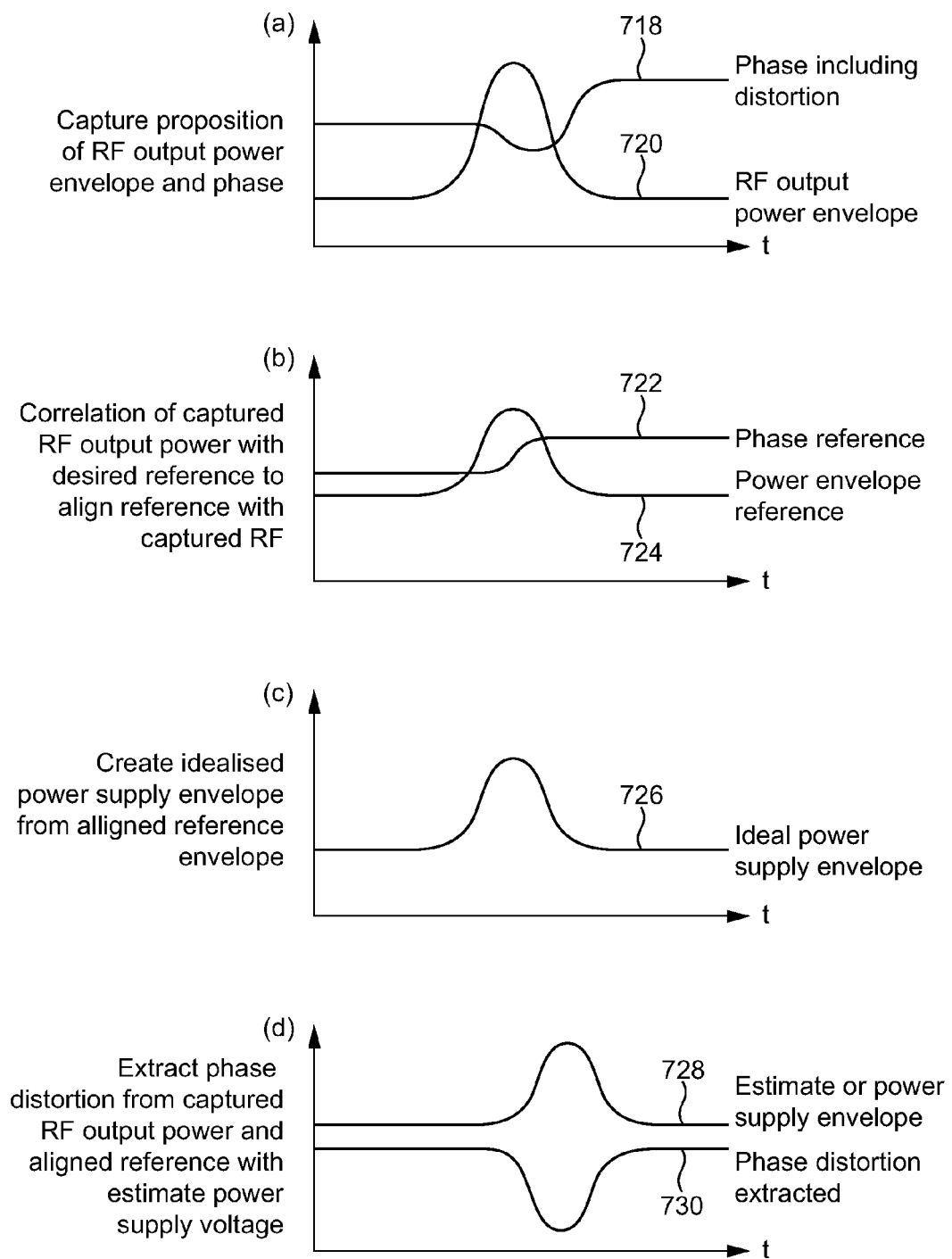
FIGS. 7a to 7d illustrate the use of phase distortion in accordance with a first embodiment of the invention.
Figure 8:
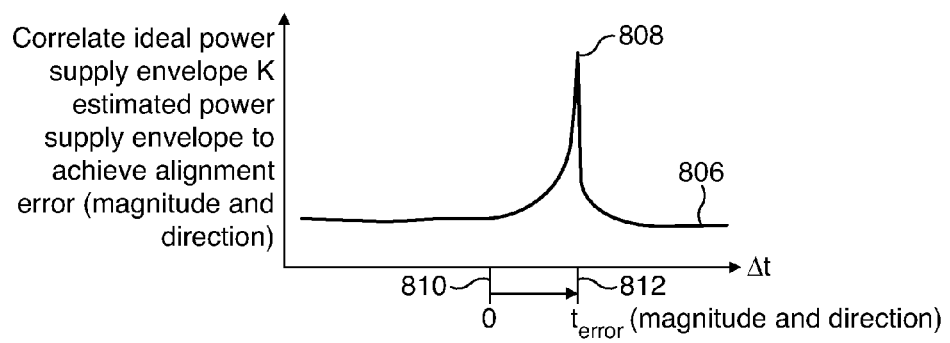
FIG. 8 illustrates the determination of an alignment error in accordance with the first embodiment of the invention.
Figure 9:
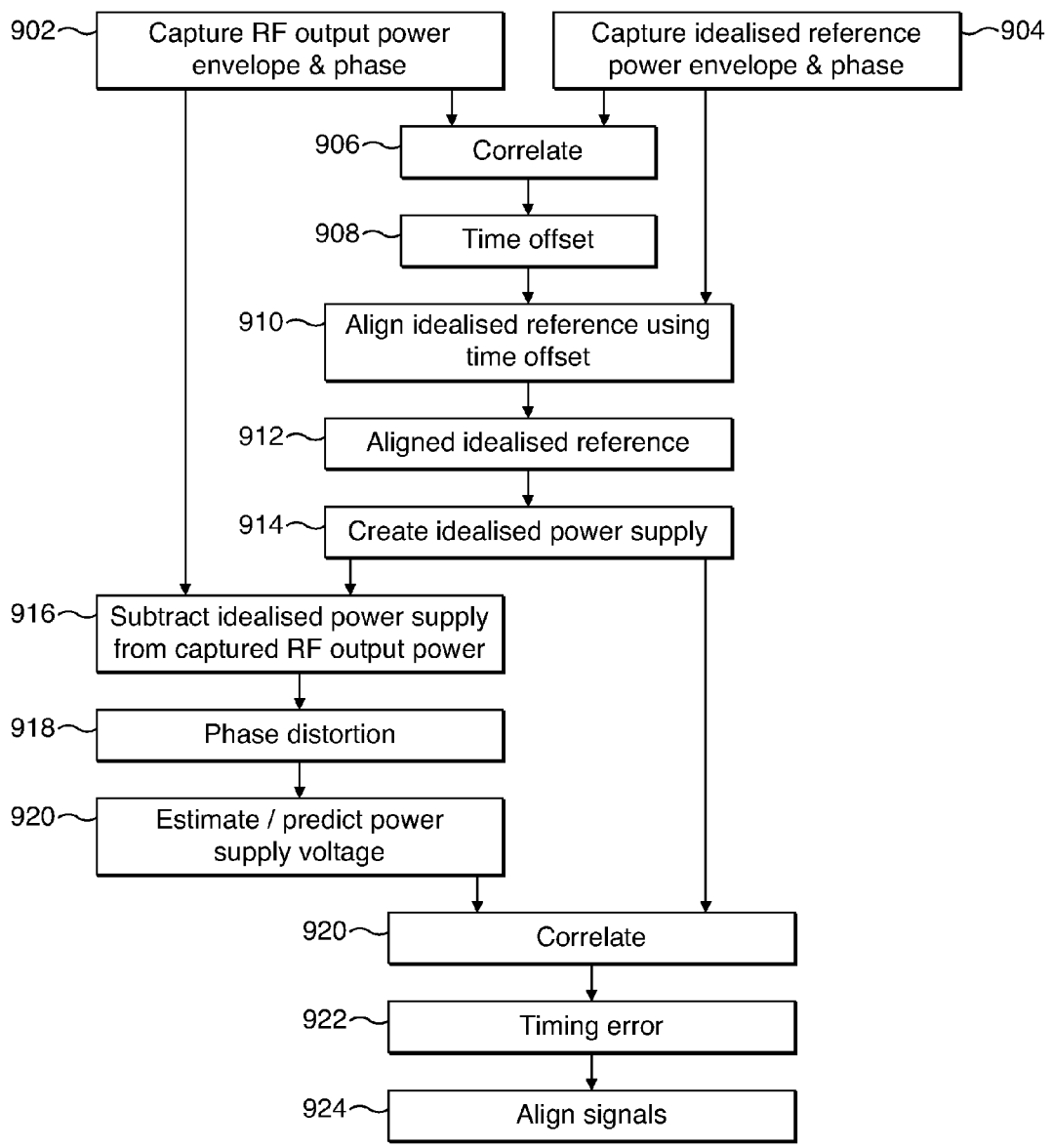
FIG. 9 illustrates the steps performed to remove an alignment error in accordance with the principles of the first embodiment of the invention.

In accordance with the first embodiment of the invention the phase distortion is used to determine a timing misalignment, and from determination of the timing misalignment the amplification stage is adapted to synchronise or realign signals to provide an aligned system. The principles of the first embodiment of the invention are now described with reference to FIGS. 7 to 10. FIG. 9 illustrates the method steps carried out in accordance with the principles of the first embodiment, and FIGS. 7 and 8 illustrate waveforms of the amplification stage 100 of FIG. 1 at various stages of the process.

In a first step 902 of FIG. 9, the envelope and phase of the RF output power on line 116 is captured. The output of the RF amplifier is observed over a period of time, and sampled, such sampled output over the period of time being the "captured" RF output power. With reference to FIG. 7a there is illustrated the captured RF output power envelope and phase. The captured portion over a particular time period is illustrated. The RF output power envelope is represented by reference number 720, the phase is represented by reference numeral 718. It can be noted that the envelope and phase illustrated in FIG. 7a corresponds to the envelope and phase illustrated in FIG. 5d, the phase of the RF output signal being the combination of the phase of the RF input signal distorted by the phase provided by the misaligned power supply.

In addition to capturing the RF output power envelope and phase over a given time period, in a step 904 the "idealised" reference power envelope and phase are captured over the same timings as denoted by step 904 of FIG. 9. In arrangements in which the input to the power amplifier 102 is provided by a pre-distortion stage, the idealised reference is the input to the power amplifier without any pre-distortion. In other words the idealised reference power envelope and phase captured in step 904 is the exact signal to be amplified by the power amplifier 102. FIG. 7b illustrates the idealised reference power envelope and phase. Reference numeral 722 identifies the phase waveform and reference numeral 724 identifies the envelope waveform.

As denoted by step 906 of FIG. 9, the captured RF output power envelope and phase in step 902 is correlated with the captured idealised reference power envelope and phase in step 904. The result of such correlation is provided in step 908, and gives information as to the time offset between the output power signal and the idealised reference signal. This time information is used in step 910 to align the idealised reference, such that the idealised reference is aligned to the same timeframe as the captured output power signal.

Using the aligned idealised reference signal provided in step 912 as a result of the alignment of step 910, in a step 914 an idealised power supply and signal is created. The idealised power supply signal is created using a known function. This function uses information as to how the actual power supply voltage is generated. The power supply voltage is typically not exactly the same as the reference envelope. For example, the actual power supply voltage typically cannot drop to zero even if the reference does. Thus the creation of the idealised power supply in step 914 based on the aligned idealised reference applies a function to the idealised reference, based on knowledge of how the power supply voltage is shaped for delivery to the power amplifier, to create an idealised power supply. This shaping function applied to the aligned idealised reference in order to obtain the idealised power supply is the same function applied to the power supply generated by the envelope tracking power supply 104 of FIG. 1.

The steps of FIG. 9 described hereinabove to create an idealised power supply are known in the art. Various techniques will be familiar to one skilled in the art. The invention, and its embodiments, is not limited to any specific technique for creating an idealised power supply.

FIG. 7c illustrates a representation of the idealised power supply for the time period under analysis. The waveform is illustrated by reference numeral 726. The waveform 726 is thus generated in dependence on the appropriate shaping function being applied to the waveform 724.

In a step 916, the idealised power supply generated in step 914 is subtracted from the captured RF output power signal captured in step 902. This subtraction results in a phase distortion signal as denoted by step 918. Thus the phase distortion is extracted from the RF power modulation by comparing it with the reference signal (the idealised power supply signal being based on the reference signal).

In a step 920 of FIG. 9 an estimate or prediction of the actual power supply voltage is made in dependence on the phase distortion provided in step 918. This estimation is provided using the idealised function of FIG. 4, i.e. assuming that all signals are timing aligned. With reference to FIG. 7d there is illustrated as waveform 730 the phase distortion extracted in step 918, and the estimate of the power supply envelope is illustrated as waveform 728 (generated in step 920). As seen in FIG. 7d the phase waveform 730 and the envelope waveform 728 are aligned in time. This is because the envelope waveform 728 is generated in dependence on the phase waveform 730, the phase waveform being delayed in time in view of misalignment.

In a step 920 a further correlation is performed. The estimate/prediction of the power supply voltage generated in step 920 is correlated with the idealised power supply generated in step 914. The result of such a correlation is illustrated in FIG. 8. As denoted by reference numeral 810 there is provided a time base of zero. The correlation function 806 peaks at a point 808 at a time $t_{error}$ denoted by reference numeral 812. The time $t_{error}$ denotes the magnitude and direction of the alignment error between the estimated power supply voltage and the idealised power supply voltage. Thus in step 922 there is generated the timing error representing the misalignment between the estimate of the power supply voltage and the idealised power supply voltage. This timing error provides the misalignment information of the signals in the RF amplification stage.

Once the timing error is generated in step 922, this information is used in a step 924 to align, in time, the signals of the RF amplification stage.

It should be noted with respect to FIG. 8 that if the peak of the correlation function occurs at time t=0, no alignment error is present.

Re-adjustment of the signals in step 924 may be performed in a number of ways. The RF input signal on line 108 supplied to the power amplifier 102 may be delayed by an amount corresponding to the timing error. The power supply enveloped amount provided on signal line 112 may be delayed by a time corresponding to the timing error. The envelope tracking power supply 104 may be adapted to delay the generation of the power supply signal on line 114 by a delay corresponding to the timing error. Thus the timing error information generated in step 922 is used to align the signals in step 924 so as to remove any alignment error.

The method steps of FIG. 9 may be operated continuously such that continuous adjustment of the delay to compensate for the timing error may take place. Timing alignments may therefore take place in an automatic manner.

A typical practical implementation will almost always include a pre-distortion stage prior to the input of the power amplifier 102 of FIG. 1. Such a pre-distortion stage reduces the phase distortion, and any other distortion, in the RF input signal to the amplifier. A pre-distortion stage typically applies a deliberate and opposite distortion to the distortion that is to be eliminated, being distortion which is generated in the amplification stage. This pre-distortion results in a desired spectral purity in the RF power output signal of the amplifier, at the expense of extra bandwidth and distortion at the power amplifier input.

The techniques of the first embodiment as described herein may work directly with a pre-distortion stage provided for the power amplifier. The first embodiment utilises a technique in which the phase distortion of the output signal is measured, and this measurement may be fed back to the pre-distortion unit.

It should be noted that where the technique of the first embodiment is implemented in an amplification stage including a pre-distortion unit, the comparison of the RF output power modulation with the reference power in the correlation step of 906 needs to be on the basis of the pre-distorted reference, i.e. the idealised reference. The use of the pre-distorted signal is necessary to establish the true and actual phase distortion present. Thus in the description of FIG. 9 reference to the "idealised" reference power in step 904 is a reference to the RF input power which will be applied to the power amplifier in the absence of any pre-distortion, distortion, which may be considered to be the RF input power signal to the amplification stage rather than directly to the power amplifier where pre-distortion is implemented.

Figure 10:
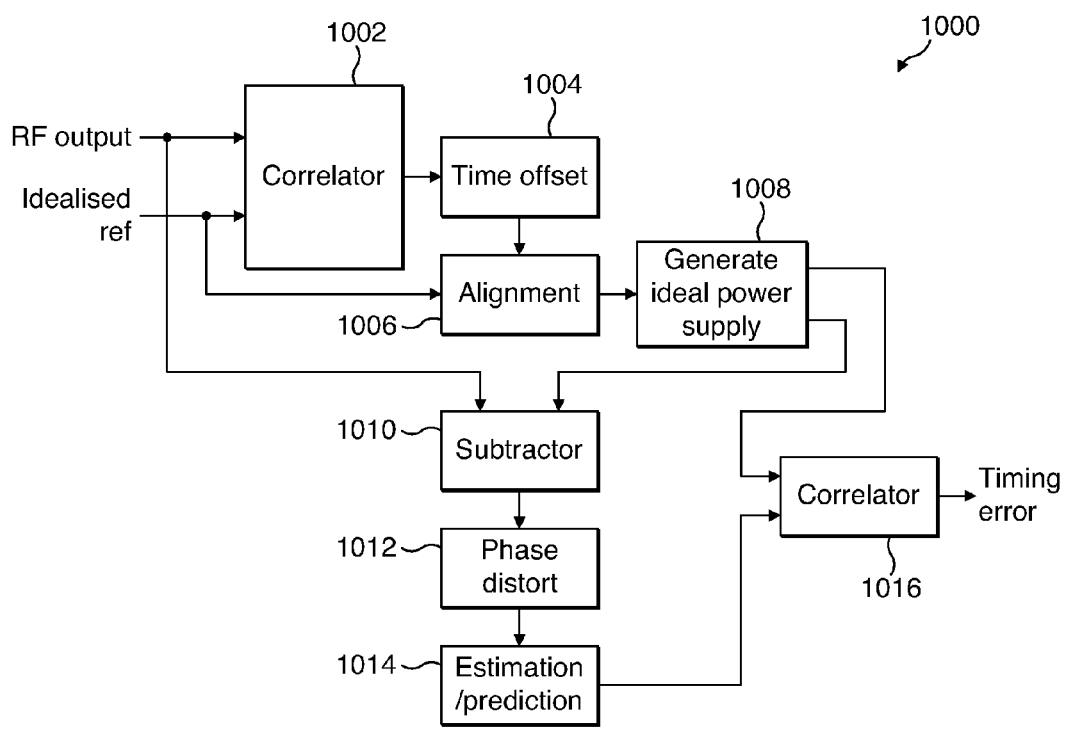
FIG. 10 illustrates schematically an amplification stage implementing the techniques in accordance with the first embodiment of the invention.

With reference to FIG. 10, there is illustrated an exemplary implementation of an RF amplification stage utilising the techniques of the first embodiment of the invention.

As illustrated in FIG. 10, the RF amplification stage is adapted to include circuitry 1000 including a correlator 1002, a time offset block 1004, a signal alignment block 1006, a subtractor 1010, a phase distorter 1012, an estimator/predictor 1014, a generator 1008, and a correlator 1016. The circuitry receives as inputs the captured RF output power envelope and phase, captured from the RF output signal on line 116, and a representation of the idealized reference power envelope and phase, such as may be captured from the RF input signal on line 108. The timing error information is generated as the output of the circuitry 1000.

The operation of the circuitry 1000 of FIG. 10 will be apparent from the description of the flow diagram of FIG. 9.

The above-described technique of the first embodiment relies upon the presence of phase distortion in the RF output signal to remove an alignment error in the signals of the amplification stage. As discussed above, the phase distortion present in the RF output signal is a characteristic of modern RF power amplifier technologies. The presence of such phase distortion in the RF output power signal is undesirable. Future RF power amplifier technologies may therefore be improved such that no phase distortion is present in the RF output power signal. Where no phase distortion is present in the output signal, then the technique of the first embodiment cannot be used to rectify timing alignment problems.

The alignment of the signals of the amplification stage in time is still desirable for efficiency purposes even if phase distortion is not a problem.

Figure 11:
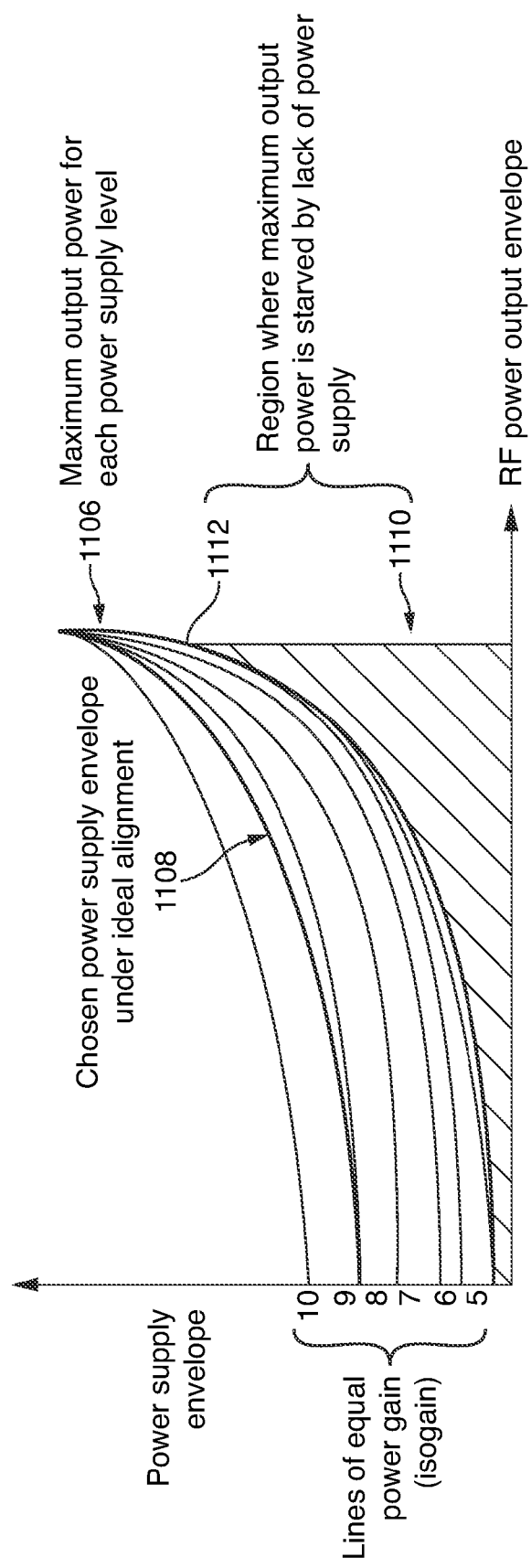
FIG. 11 illustrates the relationship of power amplifier gain and output power with the supply voltage in an envelope tracking amplification stage.

With reference to FIG. 11, it can be observed that it is a characteristic of a power amplifier that output power varies in accordance with variations in the power supply. All RF power amplifier technologies will exhibit reductions in power gain when the power supply is 'starved'. A power supply voltage set too low will limit the RF output power envelope. Conversely, under some circumstances, the power amplifier may exhibit some gain expansion when the power supply voltage is higher than typical or required. For example, using a voltage level that is larger than the optimal efficiency voltage may cause the amplifier output to increase for the same input power.

FIG. 11 shows a contour plot with lines of equal gain, with the changes in power supply voltage and RF output power. Reference numeral 110 illustrates the contour plot representing the chosen power supply envelope under ideal alignment. Thus for any given power supply envelope, the area underneath the waveform, such as illustrated by the area of hatched lines 1110, is the region where maximum output power is starved by a low power supply.

With a power supply envelope chosen under ideal timing alignment, the relationship of power supply envelope and output power is illustrated in FIG. 11. As illustrated, the gain remains constant in such ideal circumstances.

Figure 12:
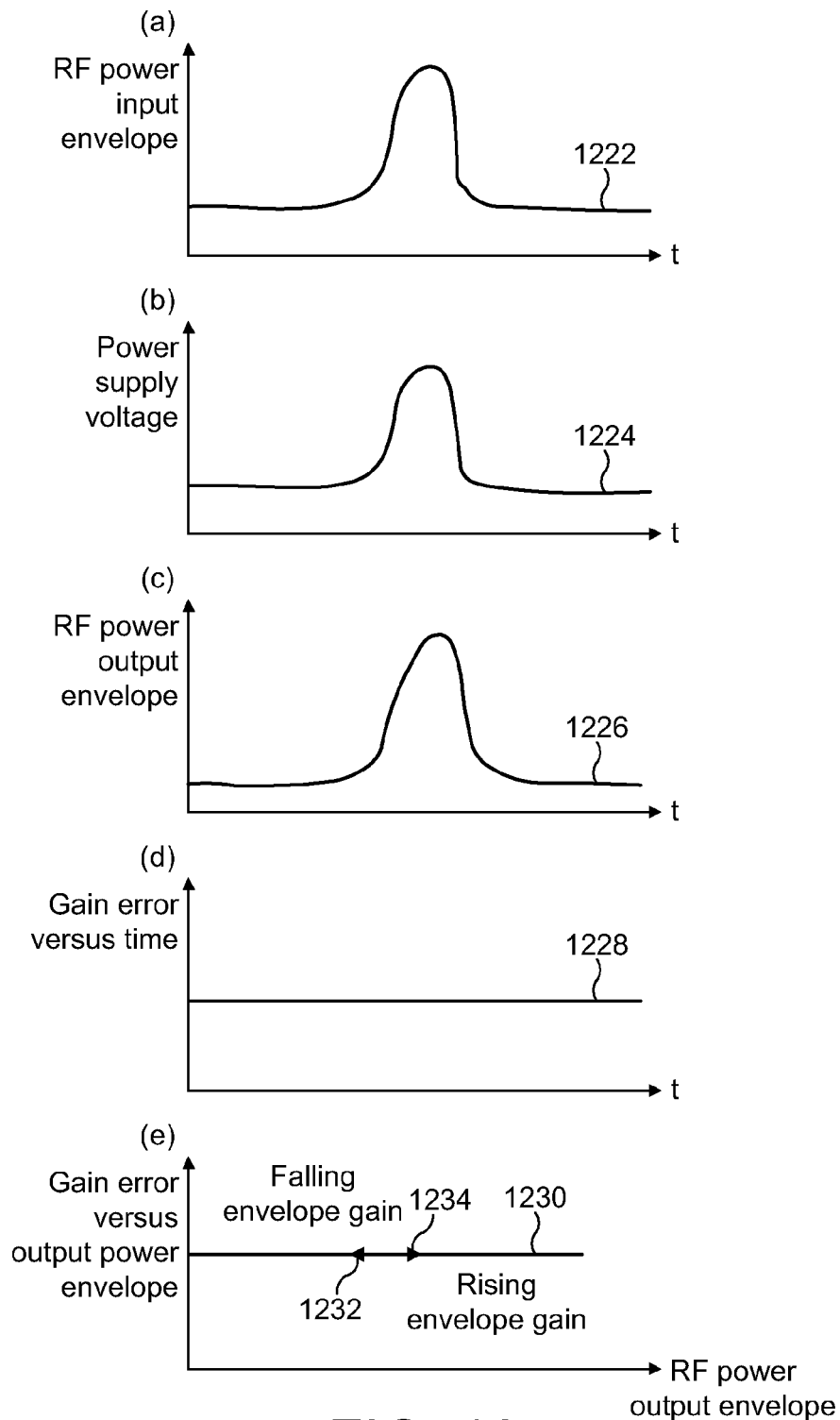
FIGS. 12a to 12e illustrate the relationship between gain and output power in an aligned envelope tracking amplification stage.

With reference to FIG. 12 there is illustrated waveforms associated with various signals of the amplification stage 100 of FIG. 1 in an idealised scenario where all signals are time-aligned.

FIG. 12a illustrates the RF power input signal envelope on line 108. Reference numeral 1222 denotes the envelope of the waveform of the input to the RF power amplifier 102.

FIG. 12b illustrates the power supply voltage provided to the power amplifier 102 on line 114. The power supply voltage waveform is identified by reference numeral 1224.

FIG. 12c illustrates the envelope of the RF power output signal on line 116 of the output of the power amplifier 102. The waveform 1226 represents the envelope.

In this idealised time-alignment situation, each of the waveforms 1222, 1224 and 1226 of FIGS. 12a to 12c are in alignment. FIG. 12d illustrates the gain error over time of the amplification stage. The gain error is illustrated by waveform 1228 of FIG. 12d. As illustrated by FIG. 12d, the gain remains the same for any given output power. The time-alignment of the signals of the amplification stage produces an RF output power envelope that shows no unexpected gain distortion.

FIG. 12 illustrates the gain error versus the output power envelope. When displayed as a function of the RF output power envelope, the gain distortion remains the same for a rising envelope and a falling envelope. Thus in FIG. 12e a single waveform 1230 represents the relationship between gain error and RF power output envelope whether the envelope is falling as denoted by arrow 1232 or rising as denoted by arrow 1234.

Figure 13:
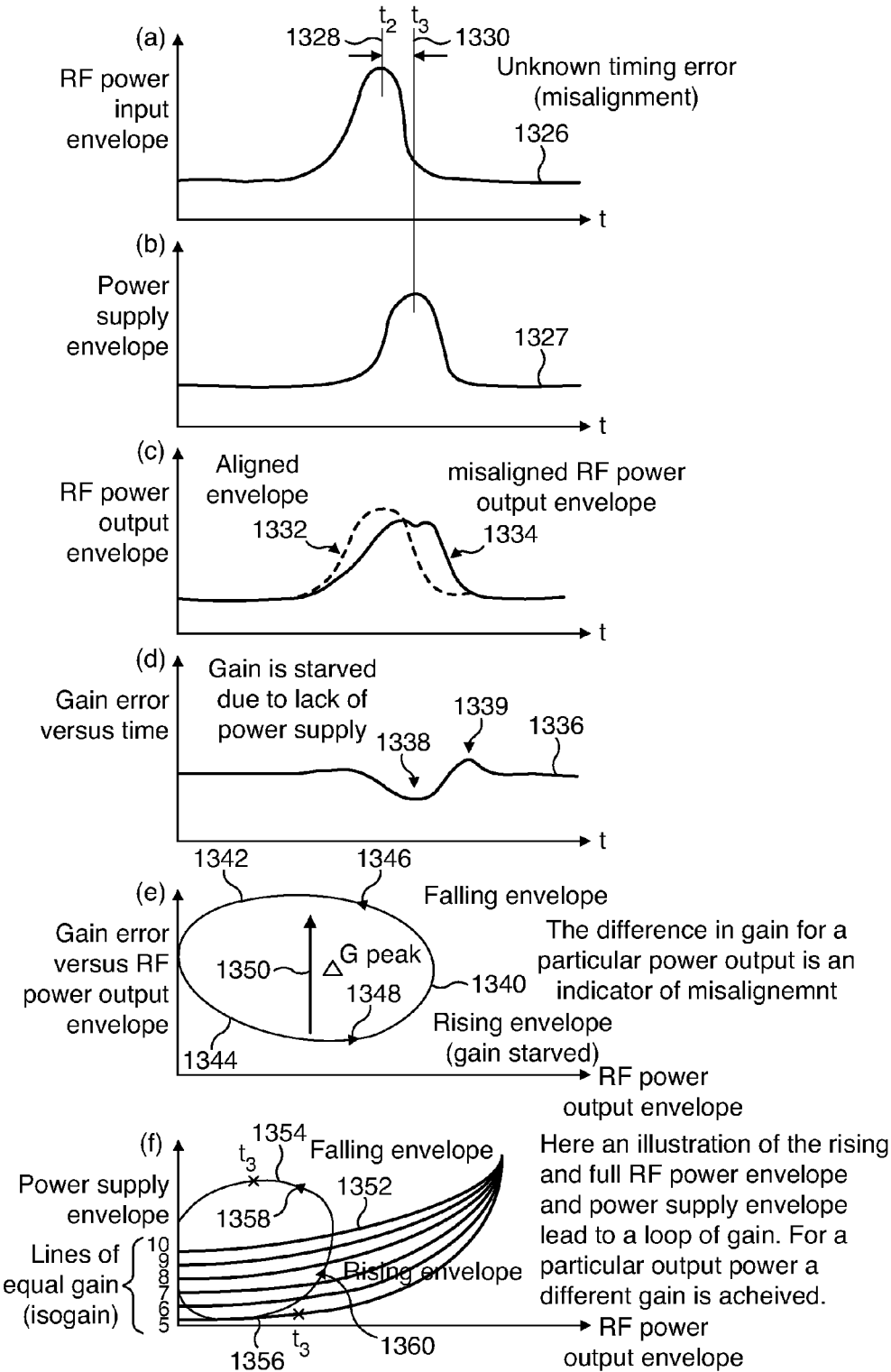
FIGS. 13a to 13f illustrate the relationship between output power and amplifier gain in relation to power supply in a misaligned envelope tracking amplification stage.

With reference to FIG. 13, there is now described the waveforms of the various signals in the amplification stage 100 of FIG. 1 in a practical application where timing alignment between the various signals does not exist.

With regard to FIG. 13a, there is illustrated the variation of the RF power input envelope of the signal on line 108 over time, the waveforms identified by reference numeral 1326. At the end of FIG. 13b there is illustrated the variation of the power supply envelope of the signal on line 114 over a corresponding period of time. As illustrated in FIGS. 13a and 13b the peak of the waveform 1326 occurs at a time $t_2$ denoted by the line 1328, whereas the peak of the waveform 1327 occurs at a time $t_3$ denoted by the dash line having reference numeral 1330. There difference between the times $t_2$ and $t_3$ is an unknown timing error due to the misalignment in time of the signals in the amplification stage.

FIG. 13c illustrates the envelope of the RF power output signal on line 116. Waveform 1334 represents the RF power output signal envelope. As denoted by dash line 1332, which denotes the aligned envelope of FIG. 12c, the actual output power envelope is misaligned. This is due to the misalignment of power supply envelope of FIG. 13b with the RF power input envelope of FIG. 13a.

As a result of the misalignment in time, the gain of the amplifier is not the same for any given output power. As illustrated in FIG. 13d the gain error versus time is variable. The gain error is illustrated by waveform 1336. As can be seen in FIG. 13d the gain error dips to a low point as denoted by reference numeral 1338 at a certain point in time, which denotes that the gain is starved due to a lack of a power supply.

The peak 1339 represents an over-supply.

FIG. 13e illustrates the gain error versus the RF power output envelope in the time-misaligned case. This can be compared with the idealised gain error versus output power envelope when signals are aligned as shown in FIG. 12e. In the time misaligned case of FIG. 13e, the relationship between gain error and RF output power envelope is different in dependence upon whether the envelope is rising or falling. The gain error for a rising envelope is illustrated by part 1344 of the waveform in the direction of the arrow 1348 to the point 1340. The gain error for a falling envelope is illustrated by the waveform 1342 in the direction of arrow 1346 from the point 1340 of the waveform. The peak gain error is determined by the height between the waveform 1344 and 1342 at its maximum point, denoted by the arrow 1350. For any given output power envelope level there are thus two potential gain errors, in dependence upon whether the envelope is rising or falling. For any given output power envelope level the difference in gain for these two scenarios (rising or falling) is an indicator of the amount of misalignment in the amplifier stage.

FIG. 13f illustrates the effect on gain distortion of the misalignment. FIG. 13f is a plot of the power supply envelope against the RF power output envelope. Various lines are illustrated being lines of equal gain. The waveform 1356 represents the gain for a rising envelope and the waveform 1354 represents a gain for the falling envelope, corresponding to the waveforms of FIG. 13e. A cross denoted by $t_2$ and a cross denoted by $t_3$ denotes the corresponding times in the waveforms of FIGS. 13a and 13b. As is illustrated as a result of the errors caused by misalignment significant differences in the gain occur at those two points. This is further evidenced by the trough and peak of the gain error as shown in FIG. 13d. As illustrated in FIG. 13f, the rise and fall of the RF power envelope and the power supply envelope lead to a loop of gain. For a particular output power, a different gain is thus achieved.

During the rising RF input envelope, the power supply envelope has not yet risen from its starting level. Therefore gain starvation occurs and the RF output power envelope rises at a much reduced rate. As the power supply envelope starts to rise, the gain of the amplifier recovers and the RF output power envelope can resume. Then as the RF input power envelope falls, the power supply envelope is larger than it needs to be. Some gain expansion therefore occurs. The time domain gain distortion is shown in FIG. 13f, and this falls when the power supply envelope is too small and rises when the power supply envelope is too high. When the gain distortion is plotted with respect to the RF output power envelope, the gain distortion on a rising envelope will be different to the falling envelope gain distortion.

Figure 14:
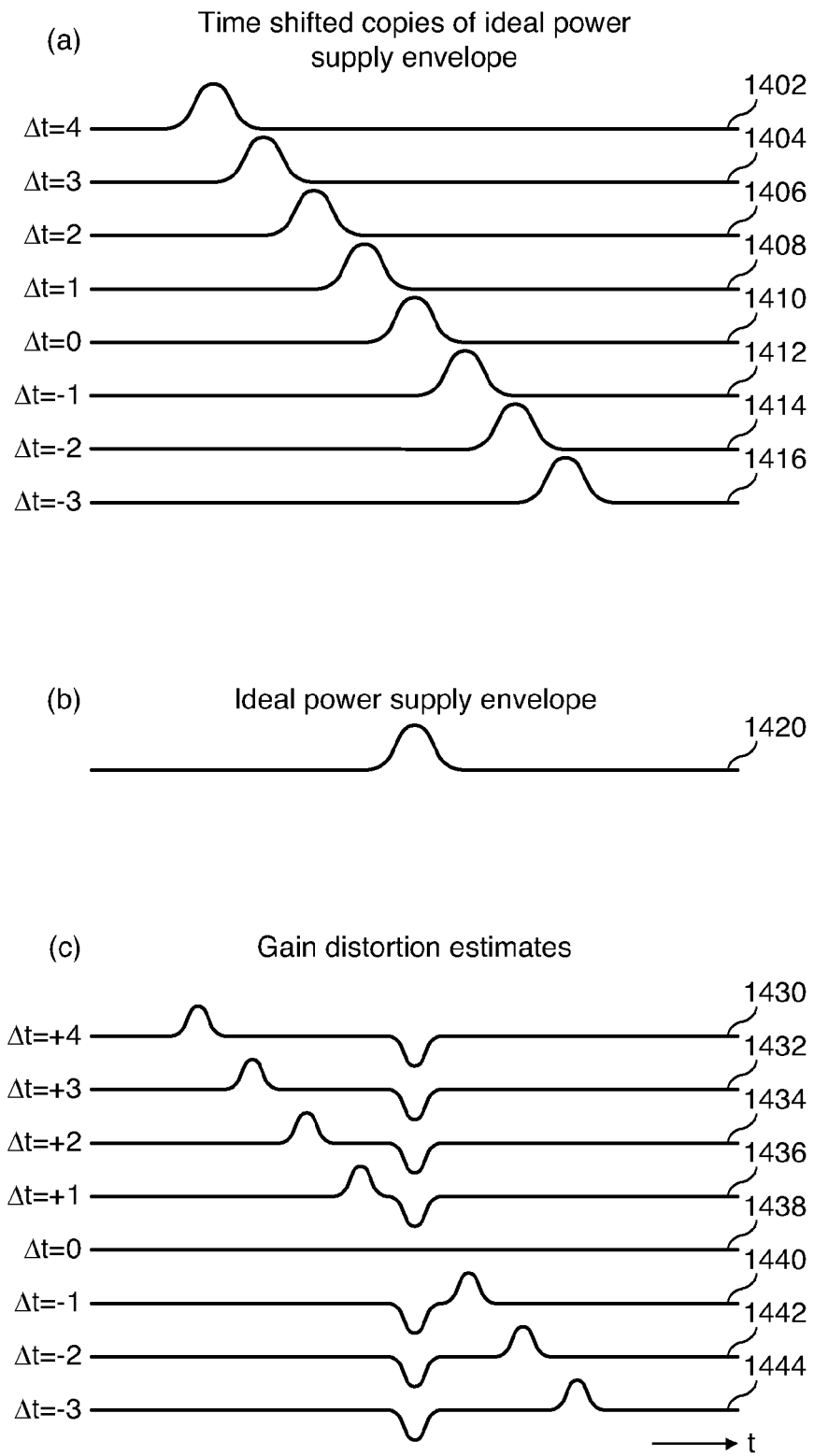
FIGS. 14a to 14e illustrate the control and generation of signals in accordance with a second embodiment of the invention.
Figure 14:
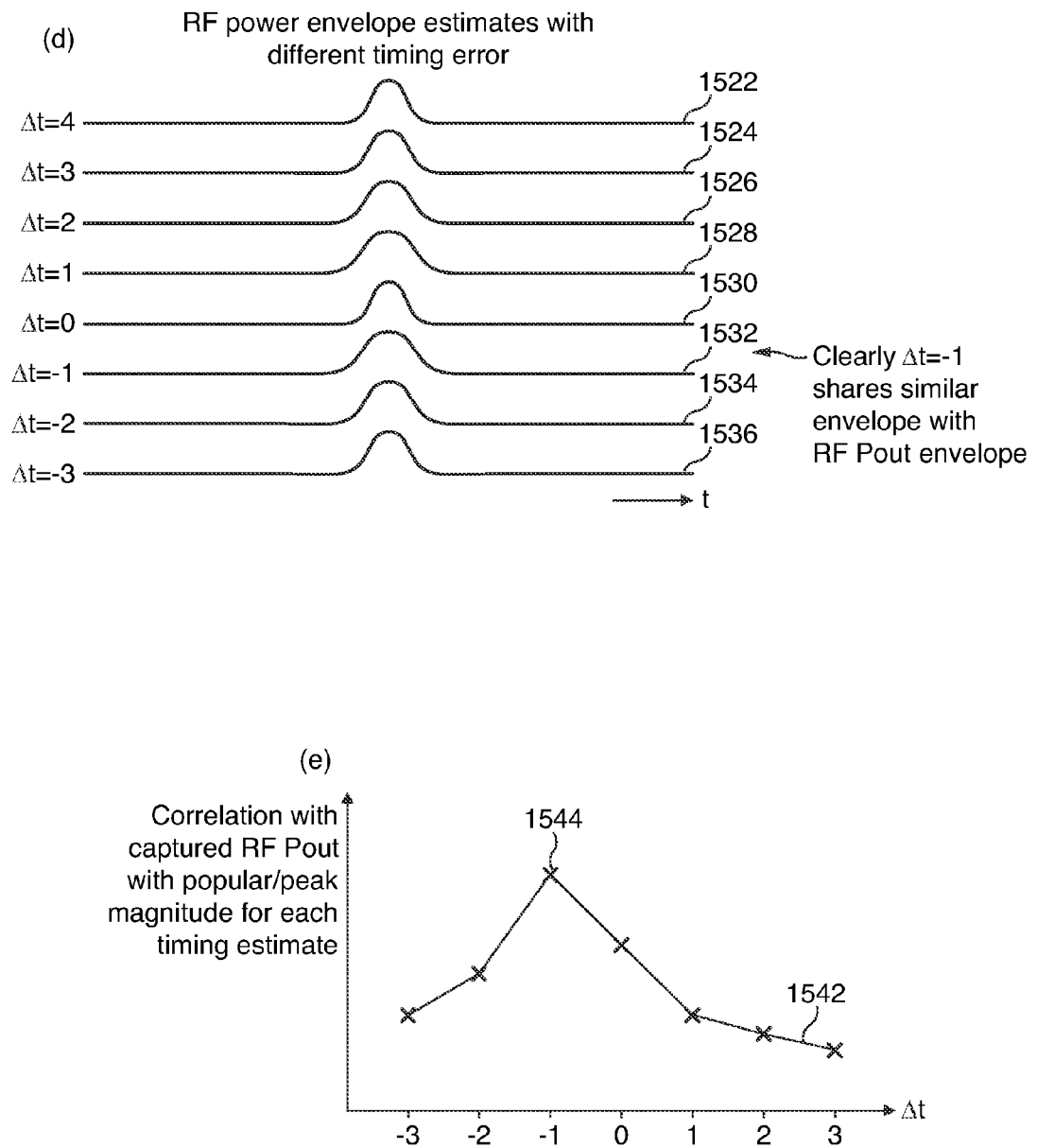
Figure 15:
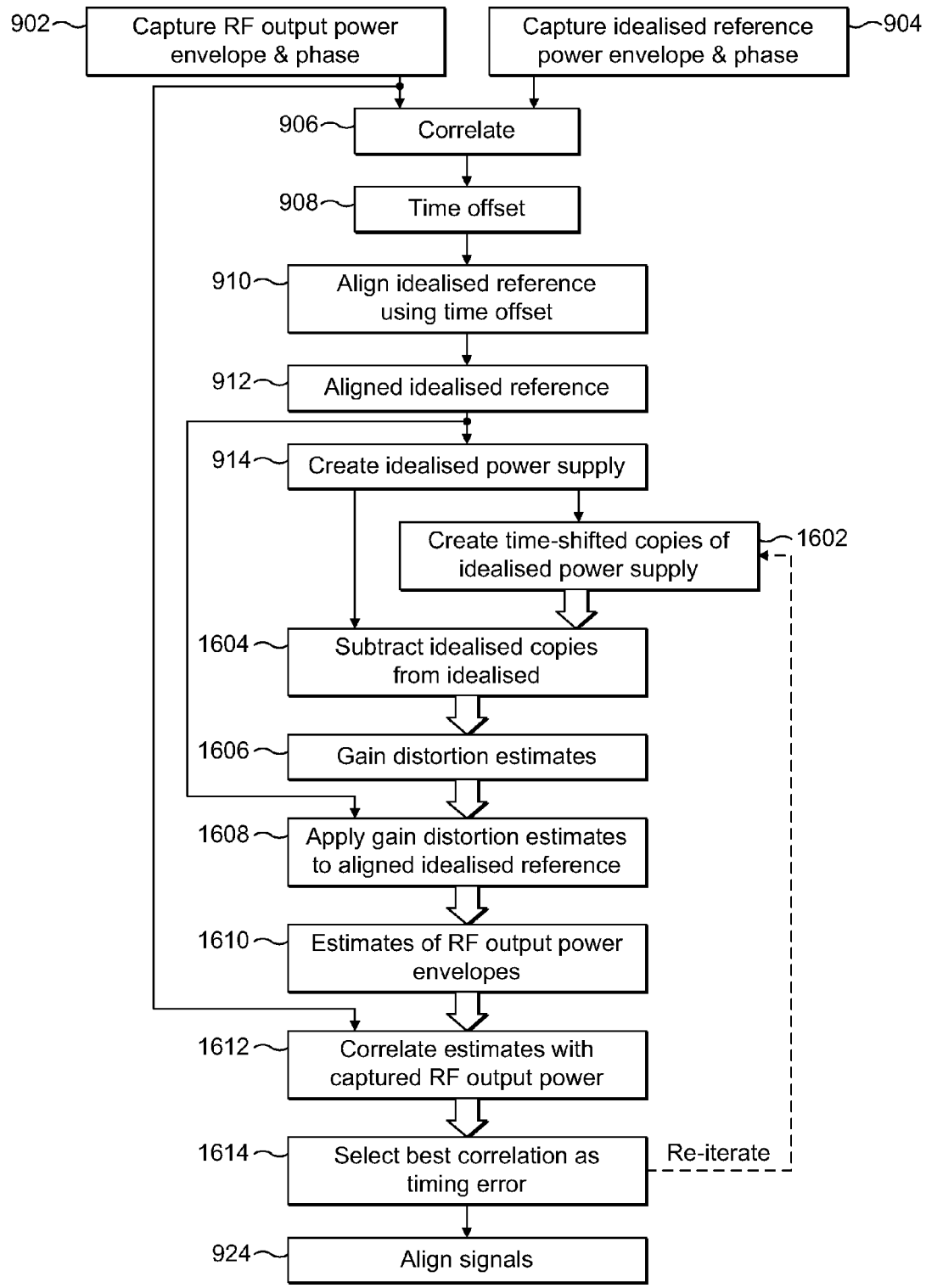
FIG. 15 illustrates a method in accordance with the principles of the second embodiment of the invention.

In accordance with the second embodiment of the invention the gain error is used to determine a timing misalignment, and from determination of the timing misalignment the amplification stage is adapted to synchronise or realign signals to provide an aligned system. The principles of the second embodiment of the invention are now described with reference to FIGS. 14 to 16. FIG. 15 illustrates the method steps carried out in accordance with the principles of the second embodiment, and FIG. 14 illustrates waveforms of the amplification stage 100 of FIG. 1 at various stages of the process.

Steps 902 to 914 of FIG. 9 are carried out in the second embodiment, and are re-presented in FIG. 15.

The RF output power envelope and phase are thus captured in a step 902 consistent with FIG. 9, although in respect of the second embodiment the phase information is not necessary. Similarly after capturing the idealised reference power envelope and phase in step 904, again the phase not being necessary, the idealised power supply waveform is created in a step 914.

The idealised power supply waveform is illustrated by waveform 1420 in FIG. 14b.

In a step 1602 a number of time-shifted copies of the idealised power supply waveform are generated. With reference to FIG. 14a, in an example eight copies are made of this waveform. Three copies are shifted earlier in time relevant to the created idealised power supply waveform of FIG. 14b, and four copies are shifted later in time. One copy is not shifted in time. An appropriate unit of time separates each copy of the idealised power supply waveform. The copy not shifted in time is representative of the idealised power supply waveform at time t=0. This is denoted by waveform 1410 in FIG. 14a. A copy of the waveform at time t=−1 is denoted by waveform 1412, a copy of the waveform at time t=−2 is denoted by waveform 1414, and a copy of the waveform at time t=−3 is denoted by waveform 1416. A copy of the waveform at time t=1 is denoted by waveform 1408, a copy of the waveform at time t=2 is denoted by waveform 1406, a copy of the waveform at time t=3 is denoted by waveform 1404, and a copy of the waveform at time t=4 is denoted by waveform 1402.

In a step 1604 each of the copies of the idealised power supply waveform generated in step 1602 are subtracted from the idealised power supply generated in step 914. The result of such step is to generate gain distortion estimates at each of the designated time offsets in a step 1606.

The thus generated gain distortion estimates are illustrated in FIG. 14c. As illustrated in FIG. 14c, at time t=0 denoted by waveform 1438 there is no gain distortion. This is because at time t=0 the idealised power supply waveform is not time shifted and therefore cancels with itself. At all other time periods an appropriate distortion of gain is calculated, being the difference between the idealised power supply envelope of FIG. 14b represented by waveform 1420, and a respective subtraction operation with each of the time shifted waveforms of FIG. 14a. It should be noted that the number of time shifted waveforms generated is implementation dependent, and the number shown in FIG. 14 is exemplary.

Thus there are generated, in the exemplary scenario, eight gain distortion estimates. With reference to FIG. 14c waveform 1430 represents the gain distortion estimate at time t=4, waveform 1432 represents the gain distortion estimate at time t=3, waveform 1434 represents the gain distortion estimate at time t=2, waveform 1436 represents the gain distortion at estimate time t=1, waveform 1438 represents the gain distortion estimate at time t=0, waveform 1440 represents the gain distortion estimate at time t=−1, waveform 1442 represents the gain distortion estimate at time t=−2, and waveform 1444 represents the gain distortion estimate at time t=−3. It will be readily apparent as to how the shape of each of the gain distortion estimates of FIG. 14c result by comparing the idealised power supply waveform of FIG. 14b with the time offset versions thereof of FIG. 14a.

Once the gain distortion estimates are generated, as illustrated by FIG. 14, in a step 1608 the gain distortion estimates are applied to the idealised, aligned reference signal generated in step 912. This is denoted by step 1608 of FIG. 15. With reference to FIG. 14d, as a result of step 1608 a number of estimates of the RF output power envelopes are generated in step 1610. Thus referring to FIG. 14d, there is provided eight estimates of the RF output power envelopes. Waveform 1522 represents the estimate at time t=4, waveform 1524 represents the estimate at time t=3, waveform 1526 represents the estimate at time t=2, waveform 1528 represents the estimate at time t=1, waveform 1530 represents the estimate at time t=0, waveform 1532 represents the estimate at time t=−1, waveform 1534 represents the estimate at time t=−2, and waveform 1536 represents the estimate at time t=−3.

In a step 1612 the estimates of the RF output power envelopes illustrated in FIG. 14d and provided in step 1610 are correlated with the captured RF output power envelope of step 902.

The resulting correlation function is illustrated in FIG. 14e. The correlation function is illustrated by waveform 1542, and is constructed of a number of discrete points corresponding to the time intervals at which the signals have been processed as discussed above. The peak of the correlation function is selected as being the best estimate of the timing error in the signals of the amplifier. In the present case the correlation function peaks at t=−1, as denoted by plot 1544. Referring to FIG. 14b, it can be seen that the waveform 1532 corresponding to time t=−1 corresponds visually most closely to the waveform 1334 of FIG. 13c, which is the waveform with gain error distortion provided at the output of the RF amplifier in the presence of misaligned signals.

Thus as a result of the correlation carried out in step 1612 it is determined in step 1614 that the correlation results at time t=−1 is the strongest results, and that therefore there is a time error of t=−1 associated with misalignment in the amplifier. Using this time information, the signals are then aligned in a step 924 consistent with the alignment step 924 of FIG. 9.

As also illustrated in FIG. 15 following the selection of the best correlation of the timing error in step 1614, the steps 1602 to 1614 may be reiterated. This reiteration may take place with a finer time difference between the discrete points at which the signal is analysed, so as to provide further fine-tuning of the alignment error.

Thus as with the first embodiment, the correlation function of step 1612 provides information concerning the size of the error and its direction. As with the first embodiment the delay to compensate for this timing alignment error may be implemented in various points within the amplification stage.

As also with the first embodiment, the second embodiment may be implemented in conjunction with the pre-distortion stage. An implementation of an amplification stage in order to provide the time alignment improvements of the second embodiment as illustrated with respect to FIG. 15 is now described with reference to FIG. 16.

Figure 16:
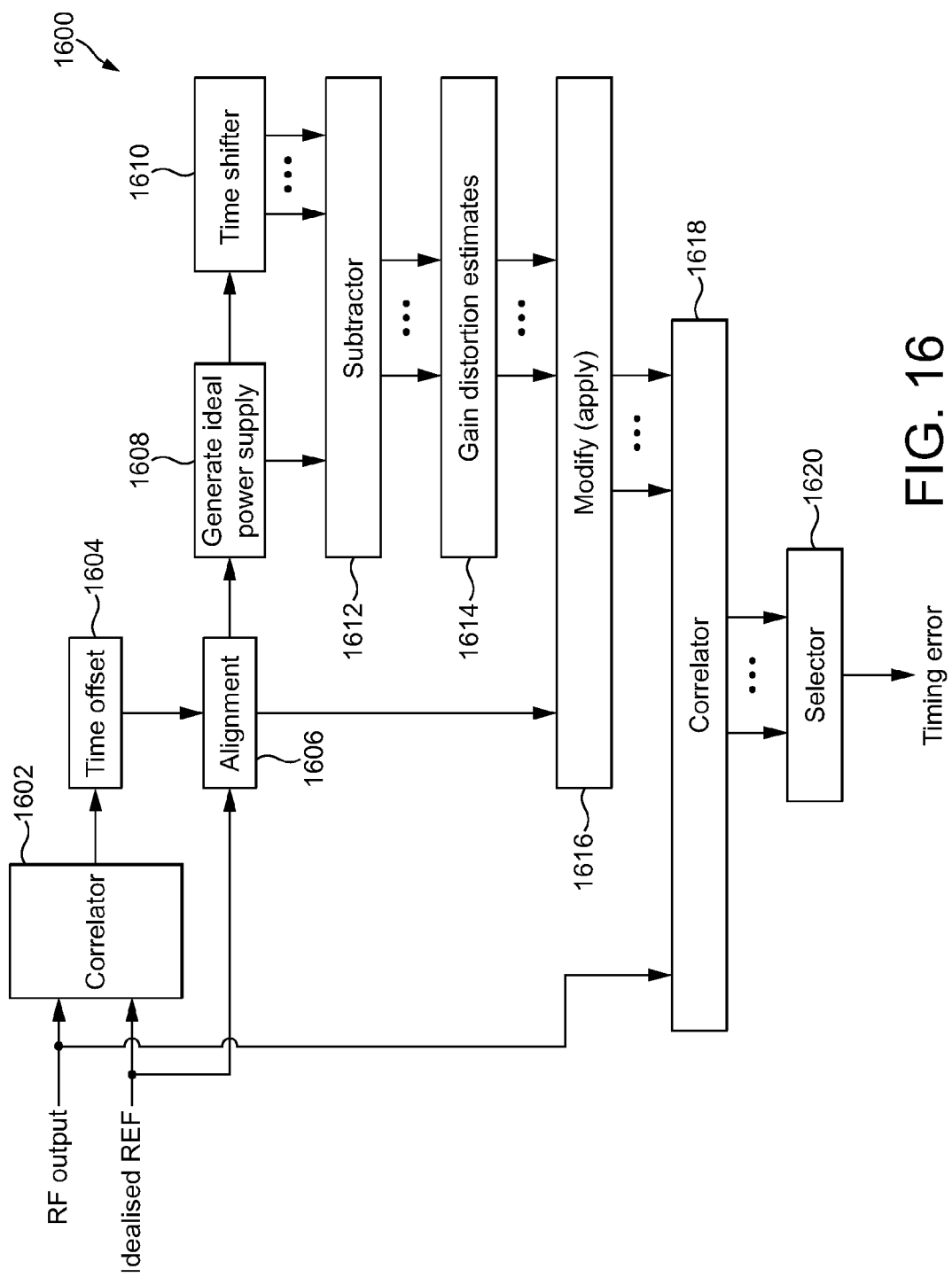
FIG. 16 illustrates an implementation of an envelope tracking amplification stage in accordance with the principles of the second embodiment of the invention.

As illustrated in FIG. 16, the RF amplification stage is adapted to include circuitry 1600 including a correlator 1602, a time offset block 1604, a signal alignment block 1606, a signal generator 1608, a time shifter block 1610, a subtractor 1612, an estimator 1614 for generating gain distortion estimates, a modification block 1616 for applying the gain distortion estimates, a correlator 1618 and a selector 1620. The circuitry receives as inputs the captured RF output power envelope and phase, captured from the RF output signal on line 116, and a representation of the idealized reference power envelope and phase, such as may be captured from the RF input signal on line 108. The timing error information is generated as the output of the circuitry 1000 by the selector 1620, which selects the 'best' output of the correlator 1618.

The operation of the circuitry 1600 of FIG. 16 will be apparent from the description of the flow diagram of FIG. 15.

The first and second embodiments use the parameters of phase and gain, respectively, to determine a timing error based on correlation. The timing error is then used to readjust the timing of signals in the amplification stage. Other techniques may be used to achieve timing alignment in accordance with further embodiments of the invention.

The invention has been described herein by way of reference to several different embodiments, in the context of application of those embodiments to an RF amplification stage. The invention is not limited to the details of any specific embodiments as described herein. The invention, and any embodiments described, are further not limited to application in an RF amplification stage. One skilled in the art will appreciate the general applicability of the principles described in the context of the various embodiments and their usefulness outside the field of RF amplification.

What is claimed is:

1. A method for determining the timing misalignment between a power supply and an output in an envelope tracking amplification stage, the method including the steps of:
    estimating a distortion parameter in the amplification stage; and determining a timing error in dependence on the estimated distortion parameter;

wherein the step of estimating the distortion parameter further includes the step of determining an idealized power supply; and wherein the step of determining an idealized power supply includes the steps of capturing a portion of the output and a portion of an input, representing an idealized reference, in the amplification stage, said portions being captured for a corresponding time period.

2. The method according to claim 1 wherein the step of determining an idealized power supply further includes the steps of:

correlating the captured portions of the output and the input;

aligning the input to the output in dependence on the correlation result; and applying a predetermined shaping function to the aligned input to create the idealized power supply for the time period.

3. A method for determining the timing misalignment between a power supply and an output in an envelope tracking amplification stage, the method including the steps of:

estimating a distortion parameter in the amplification stage; and determining a timing error in dependence on the estimated distortion parameter;

wherein the distortion parameter is phase, a phase distortion being indicative of the timing misalignment present in the output signal, the method further including the step of estimating the phase distortion in the output signal, comprising subtracting an idealized power supply from the output for a time period.

4. The method according to claim 3 further including the step of estimating the power supply in dependence on the phase distortion, the step of estimating the power supply in dependence on the phase distortion is in dependence on a known relationship between the phase distortion and the power supply in a time-aligned idealized case, the method further including the steps of:

correlating the estimated power supply with an idealized power supply; and selecting the correlation result having the highest correlation, wherein the time offset position of the highest correlation represents the timing error.

5. The method according to claim 4 wherein the timing error is used to apply a delay to one or more signals in the amplification stage.

6. The method according to claim 5 wherein the delay is applied to one or more of the power supply, the input, or an envelope provided to an envelope tracking block.

7. The method according to claim 5 wherein the delay is the inverse of the timing error.

8. A method for determining the timing misalignment between a power supply and an output in an envelope tracking amplification stage, the method including the steps of:

estimating a distortion parameter in the amplification stage; and determining a timing error in dependence on the estimated distortion parameter;

wherein the distortion parameter is gain;

wherein a gain distortion indicative of the timing misalignment is present in the output signal, the method further including the step of estimating the gain distortion in the output signal; and wherein the step of estimating the gain distortion includes the steps of:

creating a plurality of time-shifted copies of an idealized power supply;

subtracting each time-shifted copy from the idealized power supply to generate a respective plurality of time-shifted estimates of gain distortion;

applying each gain distortion estimate to the aligned idealized reference to generate a respective plurality of estimates of the output envelope;

correlating each of the plurality of estimates of the output envelope with the output; and selecting the correlation result having the highest correlation, wherein the time offset position of the highest correlation represents the timing error.

9. An envelope tracking amplification stage, adapted to determine the timing misalignment between a power supply and an output of the envelope tracking amplification stage, including:

an estimator for estimating a distortion parameter in the amplification stage; and a determination stage for determining a timing error in dependence on the estimated distortion parameter;

wherein the estimator for estimating the distortion parameter further includes a determination stage for determining an idealized power supply; and wherein the determination stage for determining an idealized power supply includes a capture stage for capturing a portion of the output and a capture stage for capturing a portion of an input, representing an idealized reference, in the amplification stage, said portions being captured for a corresponding time period.

10. The amplification stage according to claim 9 wherein the determination stage for determining an idealized power supply further includes:

a correlator for correlating the captured portions of the output and the input;

an alignment stage for aligning the input to the output in dependence on the correlation result; and a shaping stage for applying a predetermined shaping function to the aligned input to create the idealized power supply for the time period.

11. An envelope tracking amplification stage, adapted to determine the timing misalignment between a power supply and an output of the envelope tracking amplification stage, including:

an estimator for estimating a distortion parameter in the amplification stage; and a determination stage for determining a timing error in dependence on the estimated distortion parameter;

wherein the distortion parameter is phase, a phase distortion indicative of the timing misalignment being present in the output signal, the amplification stage further including a phase distortion detector for estimating the phase distortion in the output signal.

12. The amplification stage according to claim 11 wherein the phase distortion detector for estimating the phase distortion includes a subtractor for subtracting an idealized power supply from the output for a time period.

13. The amplification stage according to claim 11 further including a power supply estimator for estimating the power supply in dependence on the phase distortion is in dependence on a known relationship between the phase distortion and the power supply in a time-aligned idealized case, the amplification stage further including a correlator for correlating the estimated power supply with an idealized power supply; and a selection stage for selecting the correlation result having the highest correlation, wherein the time offset position of the highest correlation represents the timing error.

14. An envelope tracking amplification stage, adapted to determine the timing misalignment between a power supply and an output of the envelope tracking amplification stage, including:
- an estimator for estimating a distortion parameter in the amplification stage; and
- a determination stage for determining a timing error in dependence on the estimated distortion parameter;
- wherein the distortion parameter is gain, a gain distortion indicative of the timing misalignment being present in the output signal, the amplification stage further including a gain distortion detector for estimating the gain distortion in the output signal.

15. The amplification stage according to claim 14 wherein the gain distortion detector for estimating the gain distortion includes:
- a time shifter for creating a plurality of time-shifted copies of an idealized power supply; and
- a subtractor for subtracting each time-shifted copy from the idealized power supply to generate a respective plurality of time-shifted estimates of gain distortion.

16. The amplification stage according to claim 15 further including:
- a circuit for applying each gain distortion estimate to the aligned idealized reference to generate a respective plurality of estimates of the output envelope;
- a correlator for correlating each of the plurality of estimates of the output envelope with the output; and
- a selector for selecting the correlation result having the highest correlation, wherein the time offset position of the highest correlation represents the timing error.

* * * * *